United States Patent [19]

Barrella

[11] Patent Number: 4,871,956
[45] Date of Patent: Oct. 3, 1989

[54] METHOD AND APPARATUS FOR CELL MONITORING AND CONTROL

[75] Inventor: Joseph N. Barrella, Irvington, N.Y.

[73] Assignee: Power Conversion Inc., Saddlebrook, N.J.

[21] Appl. No.: 158,285

[22] Filed: Feb. 18, 1988

[51] Int. Cl.⁴ ............... H02J 7/00; G08B 21/00; G01M 27/02
[52] U.S. Cl. ............... 320/13; 320/18; 320/32; 320/48; 340/636
[58] Field of Search ............... 320/13, 15, 18, 31, 320/32, 39, 48; 340/636

[56] References Cited

U.S. PATENT DOCUMENTS

| | | | |
|---|---|---|---|
| 3,454,859 | 7/1969 | Ford et al. | 320/13 X |
| 3,786,343 | 1/1974 | Ehlers | 324/29.5 |
| 4,303,877 | 12/1981 | Meinhold | 320/18 X |
| 4,616,170 | 10/1986 | Urstöger | 320/18 X |

Primary Examiner—R. J. Hickey
Attorney, Agent, or Firm—Lieberman, Rudolph & Nowak

[57] ABSTRACT

A method and apparatus for monitoring the condition of a plurality of electrochemical cells and controlling the output of said cells upon detection of a cell having a lower capacity than the others.

3 Claims, 1 Drawing Sheet

METHOD AND APPARATUS FOR CELL MONITORING AND CONTROL

FIELD OF THE INVENTION

This invention relates to the use of an electrical circuit in conjunction with multi-cell batteries which will monitor the condition of individual cells and if necessary control battery output. This invention can be particularly useful with lithium batteries where potential safety problems can arise during battery extremes of use or abuse. Should one cell have a lower capacity than the others it can manifest a low voltage condition with respect to the other cells. During such conditions, cells can overheat and vent, releasing toxic or noxious gases. In extreme circumstances they can even explode.

Specifically the invention monitors each individual cell in order to locate those cells which exhibit parameters indicative of a lower capacity, for example low voltage. Upon detecting a cell with a lower capacity, hereinafter referred to as a "problem cell", the invention can provide for removal of the load connected to the battery and discharge of the cells for safe disposal of the battery.

BACKGROUND OF THE INVENTION

Batteries which are made up of a plurality of individual cells are subject to degradation of performance when one or more of these cells has a lower capacity with respect to the other cells. Such a cell will exhibit reduced voltage output with respect to the remaining cells. When the battery is connected to a load, the combined voltage of the cells connected in series with the problem cell can cause reverse polarity in the problem cell. This can cause that cell to overheat, or may induce adverse reactions within the cell which can cause it to become hazardous.

Modern hermetically sealed lithium batteries, for example, are constructed with cells having vented casings which will open up once sufficient pressure builds within the cell. The venting of these cells, however, can release dangerous or noxious gases into the environment. Should these vents fail to operate properly, a lithium battery can explode.

It is, therefore, an object of this invention to provide a means of sequentially monitoring each of the cells comprising a battery in order to detect a problem cell before venting occurs.

It is a further object of the invention to cause the battery to be disconnected from the load, upon detection of a problem cell.

It is still a further object of the invention to cause all of the cells to discharge safely, upon detection of a problem cell, allowing for safe disposal of the battery.

SUMMARY OF THE INVENTION

This invention sequentially monitors one or more parameters representing chemical, physical or electrical characteristics of each of the cells comprising the battery. In one embodiment, the voltage of each cell is compared to a reference voltage. Upon finding a cell exhibiting low voltage characteristics an appropriate response is triggered which can include disconnection of the battery from the load, optional activation of an audible or visual alert signal and safe discharge of the cells into a resistive load for safe disposal of the battery.

Most lithium batteries are equipped with a reverse current blocking diode which prevents reverse current flow and hazardous recharging of the battery. When the battery is not connected to a load, the voltage across the diode is zero. When the battery is connected to a load however, the diode is forward biased and a voltage appears across it. One embodiment of the instant invention, which can be used with a lithium battery, begins operating only when a voltage drop is detected across the blocking diode indicating the connection to a load. This is desirable since it will protect the battery from significant current drain during the time in which the battery is not used (i.e., disconnected from the load).

It is therefore a feature of this invention to provide sequential cell monitoring of a battery which can automatically disconnect the battery from the load.

It is a further feature of this invention to provide for safe discharge of all cells, upon detecting a problem cell.

It is a further feature of this invention to provide visual or audible indication as to the condition the battery.

It is a still further feature of this invention that it can be built within the battery case itself.

It is another feature of this invention that operation of the monitoring device takes place only when the batter itself is in use thereby preventing current drain when the battery is not connected to a load.

BRIEF DESCRIPTION OF THE DRAWING

The drawing is a block diagram of one embodiment of the instant invention connected to a battery being monitored in accordance with the inventive method and apparatus.

DETAILED DESCRIPTION

Figure 1:
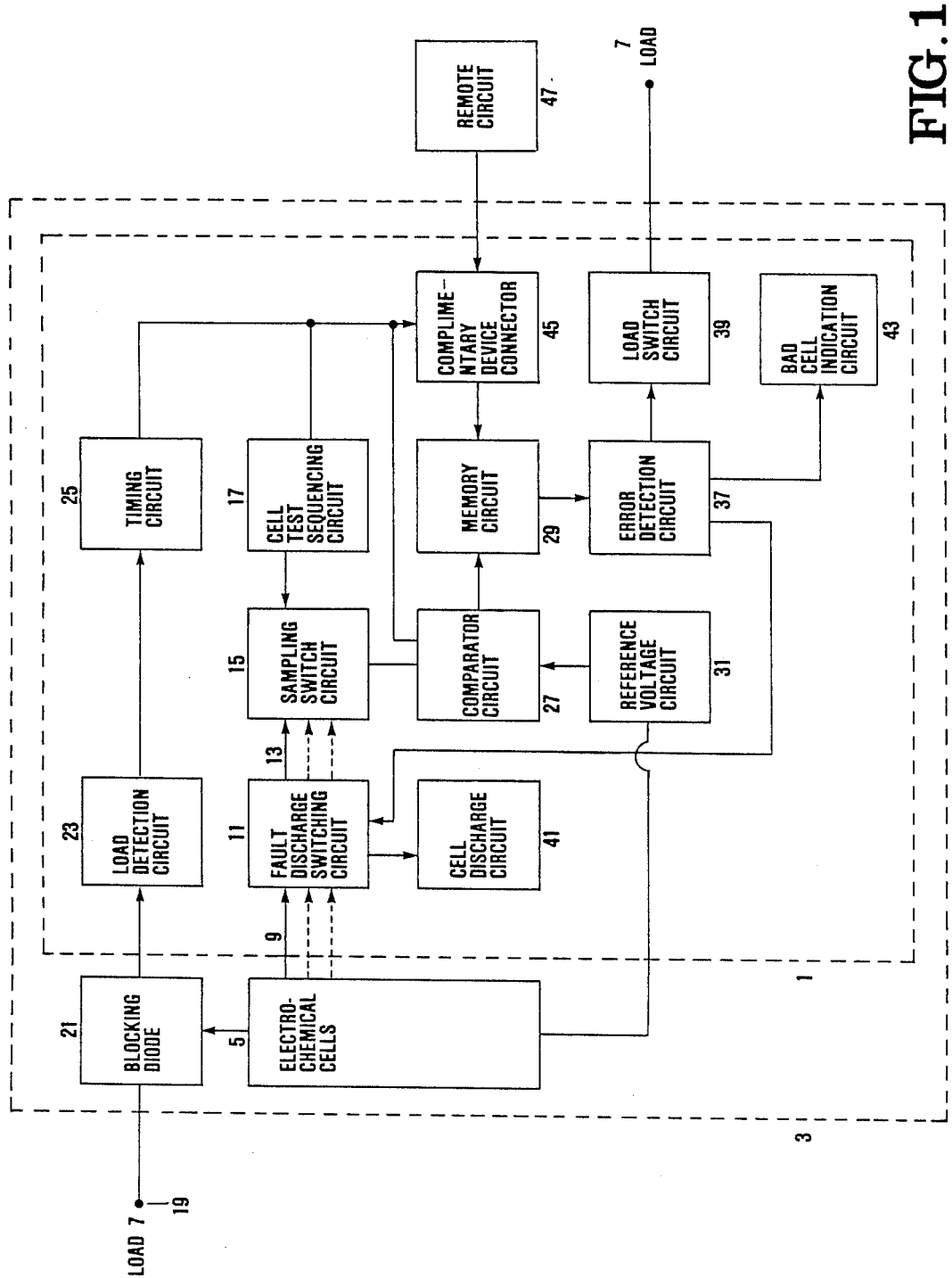

The drawing describes a preferred embodiment of the invention 1 which can be mounted within a battery casing and provides for the monitoring of individual cell voltages in order to detect a problem cell, i.e., one wit a lower capacity than the other cells. In a battery 3, the voltage source is normally comprised of one or more electrochemical cells 5, electrically combined so that the total voltage supplied to the load 7 is approximately equal to the sum of the individual cell voltages.

Each cell is connected by individual taps 9 to the fault discharge switching circuit 11 which connects the individual cell outputs 13 to the sampling switch circuit 15 which is controlled by the cell test sequencing circuit 17.

When the battery output 19 is connected to a load 7, current begins to flow through the blocking diode 21 initiating the operation of the embodiment 1 as follows. The load detection circuit 23 detects the voltage across diode 21 and activates the timing circuit 25. The timing circuit 25 provides a timed delay of about two minutes before sequential monitoring begins. In a lithium battery this may be necessary to enable the individual cells to dissipate the passivation which might have developed since the cells 5 were last connected to a load 7; allowing each cell to reach substantially its full voltage before the monitoring function begins.

After the delay period, the timing circuit 25 begins to generate clock pulses which are used to synchronize the switching and logic functions of the sampling switch circuit 15, the comparator 27 and the memory circuit 29.

The clock pulses cause the sampling switch circuit 15 to sequentially connect each of the individual cell outputs 13, one at a time, to the comparator 27. In the comparator 27, the voltage output of each cell is sequentially compared to a temperature compensated reference voltage provided by circuit 31. If the voltage of the cell being compared is lower than that of the reference voltage circuit 15, the comparator 27 generates a logical "LOW" output. If the voltage of the cell being compared is substantially the same or higher than the reference voltage circuit 31, the comparator 27 generates a logical "HIGH" output.

The output of the comparator 27 is connected to the memory circuit 29 which stores, for each of the individual cell outputs 13, the respective comparator output.

The clock pulses generated by the timing circuit 25 cause the cell test sequencing circuit 17 to continuously sample each individual cell output 13 by connecting each output 13 via the voltage sampling switch circuit 15, to the comparator 27. When the last cell output is so sampled, the cell test sequencing circuit 17 returns again to the first cell and repeats the sequence. The cell voltages are thus continuously being sampled and compared to that of the reference voltage circuit 3 and the results of each comparison is passed to the memory circuit 29.

The memory circuit 29 sequentially stores the most recent two prior comparisons output by the comparator 27, for each respective cell output 13. Kept in proper sequence by the clock pulses from the timing circuit 25, the two prior comparisons of each sequentially sampled cell 35 ar input to the error detection circuit 37 from the memory circuit 29 and therein logically combined with the most recent comparison for the respective cell.

The error detection 37 is comprised of logic gate circuitry, for example a NOR gate, which logically operates on the two prior comparisons 35 from the memory circuit 29 and the most current comparison 33. If all of these inputs are "LOW", the output of the error detection circuit 37 will be "HIGH" indicating that the cell is a problem cell signifying a fault condition, and activating the fault discharge switching circuit 11, the load switch circuit 39 and the bad cell indication circuit 43. The fault discharge switching circuit 11 switches to the "fault" mode and connects the individual outputs from the cells 9 into the cell discharge circuit 41 so that the cells 5 can safely discharge. The load switch circuit 39 disconnects the battery 3 from the load 7, and the bad cell indicator circuit 43 is activated by the error detection circuit 37 audibly or visually indicating a problem cell.

The blocks of the drawings represent functional circuits known in the art and in many cases they are available as integrated circuits.

The fault discharge switching circuit 11 comprises a series of individual field effect transistors which when activated by a change of logic state from the error detection circuit 37 switches the respective outputs from the cells 9 into the cell discharge circuit 41.

The load detection circuit 23 is a semiconductor switch which, sensing a voltage drop across diode 21, generates an activating signal when the battery 3 is connected to a load 7.

The timing circuit is a "timer" circuit such as a 4541 integrated circuit which provides the necessary clock pulses. It is connected to an RC type delay circuit which delays activation of the timer and the associated circuits in the embodiment a explained above.

The cell test sequencing circuit 17 is a digital circuit such as a 74C164 shift register, with its outputs connected to form a counter which controls the sequential activation of a series of electronic switches comprising the sampling switch circuit 15 which in turn act to connect each individual cell output 13, one at a time, to the comparator 27.

The reference voltage circuit 31 is comprised of a temperature compensated zener diode circuit which taps off of the total battery voltage, and is well known in the art.

The memory circuit 29 comprises plurality of shift registers which are sequentially activated in synchronization with the cell test sequencing circuit 1 and the sampling switch circuit 15. Each time a particular cell is selected by the sampling switch circuit 15 and tested by the comparator 27, the output of the comparator is input into the respective shift register of the memory circuit 29. Each shift register thereby stores at any one time, prior "samples" of the voltage comparison for the respective cell output 13.

The load switch circuit 39 is a semiconductor switch, i.e. a MOSFET, which during normal operation, conects the output of the blocking diode 21 to the load 7. When a fault condition is indicated, the switch circuit 39 breaks the connection between the battery 3 and the load 7.

The bad cell indicator circuit 43 is a semiconductor switch connected to a lamp or audible annunciator circuit, activated by a signal from the error detection circuit 37.

In situations where separate groups of cells are each connected in separate circuits incorporating the instant invention, but are incorporated in one battery 3, it may be desirous to activate the error detection circuit 37 of each circuit upon detection of a fault condition in either one of them. Complimentary device connector 45 can be used to activate the error detection circuit 37 of one circuit, for example embodiment 1, when a fault condition occurs in another remote circuit 47. The complimentary device connector 45 can comprise an optically coupled transistor circuit, connecting the error detection circuit 37 of one circuit 1 to the other circuit 47.

Although the embodiment of invention described herein monitors individual cell voltages in order to detect problem cells, it is to be understood that other physical, chemical and electrical parameters such as temperature, current, etc. can also be monitored for this purpose.

Other embodiments of this invention include the incorporation of most of the invention in a single integrated circuit structure.

One or more microprocessors can be used in place of discrete circuits in order to provide the functions represented by the blocks in the drawing. A flowchart and program listing for the microprocessor can be easily derived from the information detailed herein, by a person skilled in the art and without undue experimentation.

The foregoing disclosure and description of the invention is illustrative and explanatory thereof and various changes in the size and timing component circuitry, as well as in the details of the illustrated construction may be made within the scope of the appended claims without departing from the spirit of the invention.

I claim:

1. A method for monitoring the voltage of a plurality of electrochemical cells connected to an external load, and controlling the output of said cells, comprising the steps of:

(a) comparing said voltage of each cell to a reference voltage;

(b) upon detection of a predetermined difference between said cell voltage and said reference voltage, automatically disconnecting said cells from said load and automatically connecting said cells to an impedance for safe discharge, said step of comparing said voltage of each cell with said reference voltage comprising the additional steps of:

(c) storing the results of n comparisons for each cell;

(d) making an n+1 comparison between said voltage of each cell and said reference voltage; and (e) comparing the stored results of each cell's n comparisons to the results of its n+1 comparisons.

2. A method for monitoring and controlling the output of a plurality of electrochemical cells connected to an external load, comprising the steps of:

(a) upon the detection of a current flow, sequentially sampling and comparing the voltage of each cell to a fixed voltage reference;

(b) for each cell, storing a plurality of said comparisons;

(c) for each cell, sequentially updating the stored comparisons;

(d) for each cell, sequentially logically combining a number of stored comparisons and the most recent comparison, in order to detect a problem cell;

(e) repeatedly sampling each cell in sequence until said load is disconnected or a problem cell is detected;

(f) upon detecting a problem cell, disconnecting said cells from said load, and causing an impedance to be placed across each cell for safe discharge.

3. An apparatus for monitoring and controlling the voltage of a plurality of electrochemical cells, to which a load is selectively connected comprising:

(a) sampling switch means for sequentially connecting each cell to a comparator means;

(b) cell test sequencing means to control the sampling switch means;

(c) voltage reference means to be electronically compared in the comparator means, with the ell sequentially selected by the sampling switch means;

(d) memory means for storing a plurality of comparisons made for each cell in the comparator means;

(e) error detection means for logically combining the stored comparisons with a most recent comparison for each cell;

(f) timing means for synchronizing the operation of the cell test sequencing means, and the memory means;

(g) load switch means for disconnecting the load from the circuit upon receiving a signal from the error detection means;

(h) cell discharge means; and (i) discharge switching means for connecting the individual cell voltages to the cell discharge means upon receiving a signal from the error detection means.

* * * * *